(12) United States Patent
Comfeld et al.

(10) Patent No.: US 7,842,881 B2
(45) Date of Patent: Nov. 30, 2010

(54) SOLAR CELL STRUCTURE WITH LOCALIZED DOPING IN CAP LAYER

(75) Inventors: Arthur Comfeld, Sandia Park, NM (US); Mark N. Stan, Albuquerque, NM (US); Paul R. Sharps, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 723 days.

(21) Appl. No.: 11/550,881

(22) Filed: Oct. 19, 2006

(65) Prior Publication Data

US 2008/0092943 A1    Apr. 24, 2008

(51) Int. Cl.
*H01L 31/00* (2006.01)
(52) U.S. Cl. ....................................... 136/261
(58) Field of Classification Search .................. 136/261, 136/255, 256, 262
See application file for complete search history.

(56) References Cited

U.S. PATENT DOCUMENTS

| | | | |
|---|---|---|---|
| 5,944,913 A * | 8/1999 | Hou et al. ................... | 136/255 |
| 6,660,928 B1 * | 12/2003 | Patton et al. ................ | 136/249 |
| 6,864,414 B2 | 3/2005 | Sharps et al. | |
| 7,071,407 B2 | 7/2006 | Faterni et al. | |
| 7,115,811 B2 * | 10/2006 | Ho et al. ..................... | 136/255 |
| 2004/0200523 A1 * | 10/2004 | King et al. .................. | 136/262 |

OTHER PUBLICATIONS

"A Model of Si Diffusion in GaAs Based on the Effect of the Fermi Level", Shaofeng Yu, Ulrich M. Gosele, The Y. Tan, Journal of Appl. Phys. 66 (7), Oct. 1, 1989, pp. 2952-2961, 1989 American Institute of Physics.
"Role of Point Defects in the Silicon Diffusion in GaAs and Al(0.3)Ga(0.7)As and in the Related Superlattice Disordering", L. Pavesi, Nguyen Hong Ky, J.D. Geniere, F.K. Reinhart, N. Baba-Ali, I. Harrison, B. Tuck, M. Henini, Journal of Appl. Phys. 71 (5), Mar. 1, 1992 pp. 2225-2237, 1992 American Institute of Physics.

* cited by examiner

*Primary Examiner*—Kuang Y Lin
*Assistant Examiner*—Steven Ha

(57) ABSTRACT

A solar cell includes a semiconductor substrate and a sequence of semiconductor layers disposed over the substrate. The sequence of semiconductor layers includes a semiconductor window layer. The solar cell also includes a semiconductor silicon-containing cap layer over the window layer. The cap layer is spatially separated from the window layer by a semiconductor barrier layer that either includes no silicon or has a silicon concentration that is significantly lower than the silicon concentration of the cap layer.

30 Claims, 4 Drawing Sheets

| | |
|---|---|
| CAP n⁺ LAYER | 66 |
| BARRIER LAYER | 64 |
| WINDOW | 62 |
| EMITTER | 60 |
| BASE | 58 |
| BSF | 56 |
| P++/n++ TUNNELING JUNCTION | 54 |
| WINDOW | 52 |
| EMITTER | 50 |
| BASE | 48 |
| BSF | 46 |
| P++/n++ TUNNELING JUNCTION | 44 |
| NUCLEATION LAYER | 42 |
| EMITTER | 40 |
| BASE | 38 |
| SUBSTRATE | 36 |
| CONTACT | 34 |

Layers 62–56 form group 32; layers 52–46 form group 30; layers 42–38 form group 28; the overall stack is 12.

FIG. 2

| | | |
|---|---|---|
| PAD | 78 | ⎫ |
| p-GaAs | 76 | BYPASS DIODE LAYERS |
| i-GaAs (i-LAYER) | 74 | |
| n-GaAs | 72 | |
| CONTACT | 70 | ⎭ |
| STOP ETCH LAYER | 68 | |
| CAP n⁺ LAYER | 66 | |
| BARRIER LAYER | 64 | |
| WINDOW | 62 | ⎫ |
| EMITTER | 60 | 32 |
| BASE | 58 | |
| BSF | 56 | ⎭ |
| P++/n++ TUNNELING JUNCTION | 54 | |
| WINDOW | 52 | ⎫ |
| EMITTER | 50 | 30 |
| BASE | 48 | |
| BSF | 46 | ⎭ |
| P++/n++ TUNNELING JUNCTION | 44 | |
| NUCLEATION LAYER | 42 | ⎫ |
| EMITTER | 40 | 28 |
| BASE | 38 | ⎭ |
| SUBSTRATE | 36 | |
| CONTACT | 34 | |

FIG.3

SOLAR CELL STRUCTURE WITH LOCALIZED DOPING IN CAP LAYER

STATEMENT REGARDING FEDERALLY SPONSORED RESEARCH OR DEVELOPMENT

The U.S. Government has a paid-up license in the invention and the right in limited circumstances to require the patent owner to license others on reasonable terms as provided for by the terms of AFRL Agreement FA9453-04-2-0041 awarded by the Air Force Research Laboratory.

TECHNICAL FIELD

The present disclosure relates to solar cells and the fabrication of solar cells, and more particularly multi-junction solar cells based on III-V semiconductor compounds.

BACKGROUND

Photovoltaic cells, also called solar cells, are an important energy source that has become available in the past several years. Solar cells currently are being used in a number of commercial and consumer-oriented applications, including satellite and other space-related applications. Some solar cells have multi junction solar cell structures that include multiple sub-cells vertically stacked one above the other on a substrate. When solar cells in an array are receiving sunlight or are illuminated, each cell is forward biased. However, if one or more of the cells are not illuminated, for example because of shadowing or damage, the shadowed cells may become reversed biased in order to carry the current generated by the illuminated cells. Such reverse biasing can degrade the cells and can ultimately render the cells inoperable. To prevent reverse biasing, a diode structure is sometimes implemented. For example, U.S. Pat. No. 6,864,414, which is assigned to the assignee of the present application, discloses a monolithic multi junction solar cell structure with an integrated bypass diode formed above the top sub-cell layers. The purpose of the bypass diode is to draw the current away from the shadowed or damaged cell. The bypass diode becomes forward biased when the shadowed cell becomes reverse biased. Rather than forcing current through the shadowed cell, the diode draws the current away from the shadowed cell and maintains the connection to the next cell.

Although fabricating the bypass diode as an integrated device can enhance its efficiency and performance, it has been have discovered that fabrication of the integrated bypass diode sometimes reduces the open circuit voltage ($V_{oc}$) of the top sub-cell, which can be undesirable.

The present invention is directed to improvements in solar cell structures.

SUMMARY

According to one aspect of the invention, a solar cell includes a semiconductor substrate and a sequence of semiconductor layers disposed over the substrate. The sequence of semiconductor layers includes a semiconductor window layer. The solar cell also includes a semiconductor silicon-containing cap layer over the window layer. The cap layer is spatially separated from the window layer by a semiconductor barrier layer that either includes no silicon or has a silicon concentration that is significantly lower (e.g., at least 50% lower) than the silicon concentration of the cap layer.

In another aspect, the invention includes a method of fabricating a solar cell. The method includes depositing a sequence of semiconductor layers to form a solar cell structure over a semiconductor substrate, wherein the sequence of semiconductor layers includes a semiconductor window layer. A semiconductor barrier layer is deposited over the window layer, and a semiconductor silicon-containing cap layer is deposited over the barrier layer. The barrier layer either includes no silicon or has a silicon concentration that is significantly lower than the silicon concentration of the cap layer.

One or more of the following features may be present in some implementations. For example, in some cases, the concentration of silicon in the barrier layer is at least two orders of magnitude less than the silicon concentration of the cap layer. The barrier layer can be thicker than the cap layer and, in some implementations, is at least several times thicker than the cap layer.

The window layer may be, for example, a III-V semiconductor compound containing aluminum, and each of the barrier layer and cap layer may include a III-V semiconductor compound. For example, the barrier and cap layers can be InGaAs layers, and the window layer can be a AlInP$_2$ layer.

The concentration of silicon in the cap layer may be, for example, in a range of about of about $1 \times 10^{18}$ cm$^{-3}$ to about $1 \times 10^{19}$ cm$^{-3}$. In some implementations, the concentration of silicon in the cap layer is in a range of about $5 \times 10^{18}$ cm$^{-3}$ to about $6 \times 10^{18}$ cm$^{-3}$.

The sequence of semiconductor layers can include a multi-junction solar cell structure having a sub-cells stacked one above the other, wherein the window layer is near the top of the stack of sub-cells.

Some implementations include various advantages. For example, the addition of the barrier layer may help prevent (or reduce) the diffusion of silicon into the window layer and, thus, may prevent (or reduce) out-diffusion of aluminum from the window layer. That can result in an increase of the open circuit voltage ($V_{oc}$) and efficiency of the solar cell.

Other features and advantages may be apparent from the following detailed description, the accompanying drawings and the claims.

BRIEF DESCRIPTION OF THE DRAWINGS

FIG. 2 illustrates an example of the solar cell layers according to the invention.

FIG. 3 illustrates an example of bypass diode layers over the solar cell layers.

DETAILED DESCRIPTION

Figure 1:
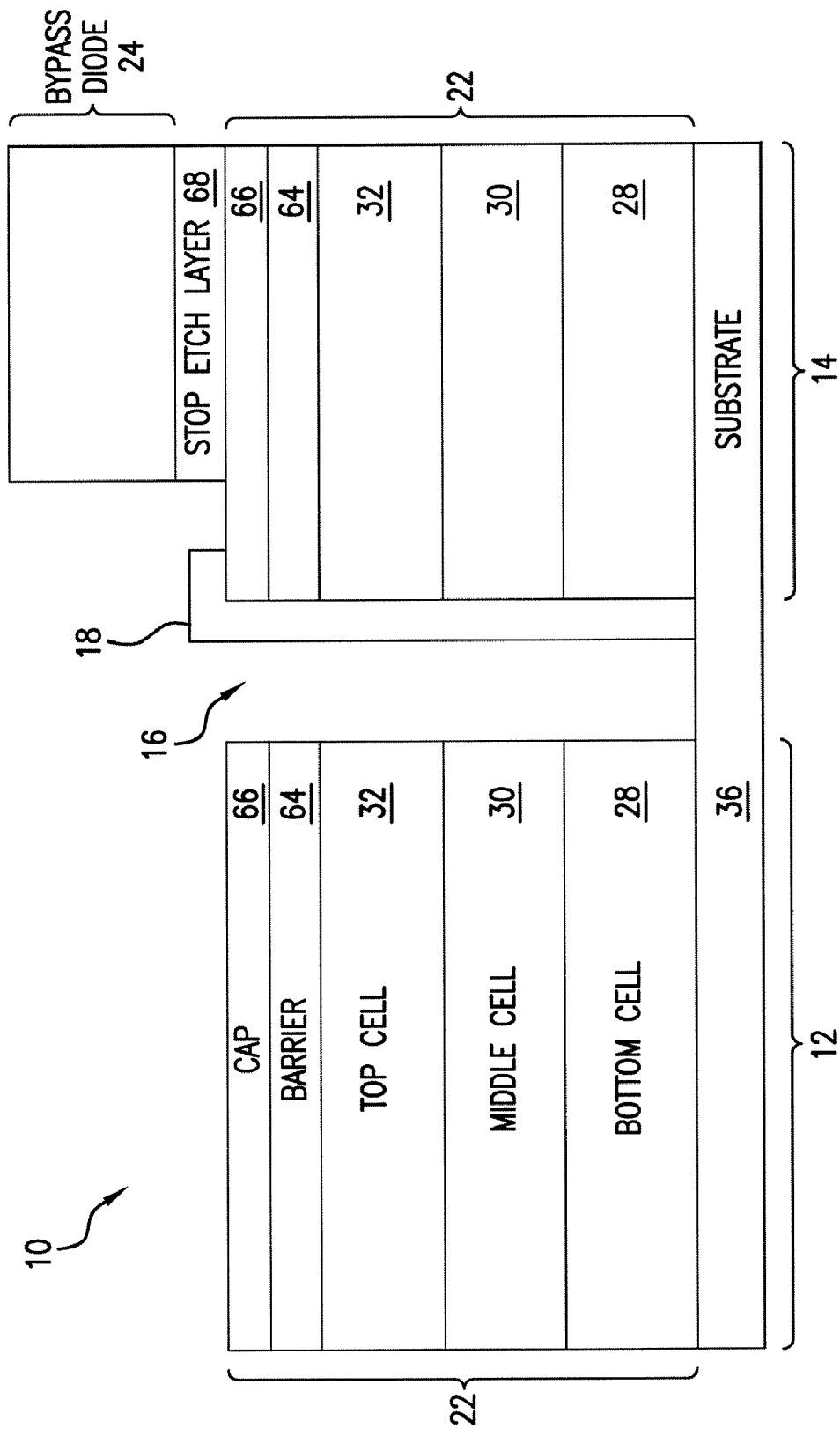
FIG. 1 illustrates an example of a solar cell according to the invention.

FIG. 1 illustrates an example of a multi-junction solar cell structure with a first portion 12 that serves as a solar cell 10 for converting solar power to electrical power and a second portion 14 that includes an integrated bypass diode 24 formed over the solar cell layers. The bypass diode 24 provides reverse bias protection for the solar cell 10. A well 16 may be formed between the solar cell 10 and the and the bypass diode 24 to provide electrical separation between the active portion of the solar cell and the bypass diode 24. The well 16 also can provide a path for a shunt 18 to access a substrate 36. The well subsequently may be filled with non-conductive materials such as antireflective materials.

In the illustrated example, the multi-junction solar cell structure 22 includes a bottom sub-cell 28, a middle sub-cell 30 and a top sub-cell 32 stacked vertically over the substrate 36. The sub-cells 28, 30, 32 include a sequence of semiconductor layers 22 deposited one atop another. Above the top cell 32 is a cap layer 66, which is separated from the top cell by a barrier layer 64, which is discussed in greater detail below.

FIG. 2 illustrates a particular implementation of the solar cell layers. In the illustrated embodiment, the substrate 36 is p-type germanium ("Ge"), with a metal contact pad 34. The bottom sub-cell 28 contains a p-type Ge base layer 38, a n-type Ge emitter layer 40, and a suitable nucleation layer 42. In particular, the base layer 38 is formed on the substrate 36, and the emitter and nucleation layers 40, 42 are deposited over the base layer 38. After the bottom sub-cell 28 is deposited, p-type and n-type tunneling junction layers 44 are deposited.

The middle sub-cell 30 includes a back surface field ("BSF") layer 46, a p-type GaAs base layer 48, an n-type InGaP emitter layer 50, and an n-type aluminum indium phosphide$_2$ ("AlInP$_2$") window layer 52. The base layer 48 is deposited over the BSF layer 46 after the BSF layer is deposited over the tunneling junction layers 44. The window layer 52 subsequently is deposited on the emitter layer 50 after the emitter layer is deposited on the base layer 48. The BSF layer 46 is used to reduce the recombination loss in the middle sub-cell 30. The BSF layer 46 drives minority carriers from a highly doped region near the back surface to minimize the effect of recombination loss. In other words, a BSF layer 46 reduces recombination loss at the backside of the solar cell and thereby reduces recombination at the base layer/BSF layer interface.

The window layer 52 in the middle sub-cell 30 also helps reduce the recombination loss and improves passivation of the cell surface of the underlying junctions. Additional layer(s) may be added or deleted without departing from the scope of the present invention. Before depositing the top cell 32, p-type and n-type tunneling junction layers 54 are deposited over the middle sub-cell 30.

The top sub-cell 32, according to the illustrated embodiment, includes a p-type indium gallium aluminum phosphide ("InGaAlP$_2$") BSF layer 56, a p-type GaInP$_2$ base layer 58, an n-type GaInP$_2$ emitter layer 60, and an n-type aluminum indium phosphide$_2$ ("AlInP$_2$") window layer 62. The base layer 58 is deposited on the BSF layer 56 after the BSF layer is deposited over the tunneling junction layers 54. The window layer 62 subsequently is deposited on the emitter layer 60 after the emitter layer is deposited on the base layer 58. In the illustrated implementation, the window layer 62 has a thickness of about 275 angstroms (Å). Different thicknesses may be appropriate for other implementations.

In the illustrated embodiment, a cap layer 66 is deposited over the window 62 of the top sub-cell 32 and is spatially separated from the window layer 62 by a barrier layer 64. The doped cap layer 66, which serves as a contact for the top sub-cell 32, can be, for example, a GaAs or InGaAs layer. In the illustrated implementation, the cap layer 66 is n-type In$_{0.015}$GaAs. Other mole fractions can be used as well.

In the illustrated example, the doped cap layer 66, which is employed for enhancing contact with metal materials, has a silicon concentration in the range of about $5 \times 10^{18}$ cm$^{-1}$ to about $6 \times 10^{18}$ cm$^{-3}$. More generally, the doped cap layer 66 typically has a silicon concentration in the range of about $1 \times 10^{18}$ cm$^{-1}$ to about $1 \times 10^{19}$ cm$^{-3}$.

The barrier layer 64 is either undoped or has a silicon density that is significantly lower than the silicon density of the cap layer 66. As used herein, a "significantly lower" silicon density means that the barrier layer 64 layer has a silicon density at least 50% lower than the silicon density of the doped cap layer 66. In some cases, it is preferable that the barrier layer 64 have a silicon density that is at least two orders of magnitude lower than that of the doped cap layer 66. Although the barrier layer 64 preferably is not intentionally doped, small amounts of silicon may, nevertheless, be present in that layer as a contaminant.

In the illustrated implementation, the barrier layer 64 is an undoped ("i-type"), or unintentionally-doped, GaAs or InGaAs layer. For example, the barrier layer 64 can be undoped or unintentionally-doped In$_{0.015}$GaAs. Other mole fractions can be used as well.

In the illustrated implementation, the n+ cap layer 66 has a thickness of about 600 Å, and the undoped (or unintentionally-doped) barrier layer 64 has a thickness of about 4150 Å. Thus, the barrier layer 64 may be several times as thick (in the illustrated example, almost seven times as thick) as the doped cap layer 66. In any event, the higher silicon-doped cap layer 66 is spatially separated from the window 62 of the top sub-cell 32.

In the illustrated implementation, particular III-V semiconductor compounds are used in the various layers of the solar cell structure. However, the multi-junction solar cell structure can be formed by other combinations of group III to V elements listed in the periodic table, wherein the group III includes boron (B), aluminum (Al), gallium (Ga), indium (In), and thallium (Tl), the group IV includes carbon (C), silicon (Si), Ge, and tin (Sn), and the group V includes nitrogen (N), phosphorus (P), arsenic (As), antimony (Sb), and bismuth (Bi).

FIG. 3 illustrates a particular implementation of the additional layers that can be included over the cap layer 66 in the portion 14 for the bypass diode 24.

As shown in the example of FIG. 3, an etch-stop layer 68 is deposited over the cap layer 66. The etch-stop layer 68 can be, for example, n-type GaInP$_2$. For situations in which subsequent fabrication steps take place at elevated temperatures, the etch-stop layer 68 of n-type AlGaAs may be advantageous.

After the etch-stop layer 68 is deposited, the layers for the p-i-n bypass diode 24 are deposited, for example, epitaxially. In the illustrated embodiment, the bypass diode 24 includes a lower n-type In$_{0.015}$GaAs contact layer 70, an n-type In$_{0.015}$GaAs base layer 72, an i-type In$_{0.015}$GaAs layer 74 layer, and a p-type In$_{0.015}$GaAs emitter layer 76. The n-type base layer 72 is deposited over the contact layer 70, the i-type layer 74 is deposited over the n-type layer 70, and the p-type layer 76 is deposited over the i-type layer 74. After layer 76 is deposited, a contact pad 78 is deposited over the bypass diode 24. Thus, a p-i-n bypass diode, having p-on-n polarity, is formed over the solar cell structure 22. In other embodiments, an n-i-p bypass diode, having n-on-p polarity, can be formed over a solar cell structure using a similar process as that described above.

In the illustrated implementation, the etch-stop layer 68 has a thickness of about 900 Å. The thicknesses of the other layers in the illustrated example are as follows: contact layer 70 (1000 Å), base layer 72 (2000 Å), intrinsic layer 74 (10000 Å), emitter layer (5000 Å) and contact layer 78 (500 Å).

Although the foregoing discussion mentions particular examples of materials and thicknesses for various layers, other implementations may use different materials and thicknesses. Also, additional layers may be added or some layers deleted in the bypass diode 24 without departing from the scope of the present invention. In some cases, an integrated device other than the bypass diode 24 may be formed over the solar cell layers 22. In other implementations, the solar cell structure may not include an integrated bypass diode or other device above the solar cell layers.

The inventors have discovered that the addition of the barrier layer 64 between the doped cap layer 66 and the window 62 can increase the open circuit voltage ($V_{oc}$) of the top sub-cell 32. While the theory of operation is not critical to the invention, it is believed that the addition of the barrier layer 64 reduces diffusion of silicon from the cap layer 66 into the window layer 62 during growth of the bypass diode layers at elevated temperatures. The addition of the barrier layer 64 effectively localizes the silicon in the n+ doped layer 66, thus preventing, or reducing, the diffusion of silicon into the window 62. Diffusion of silicon into the window 62 is undesirable because it causes out-diffusion of aluminum from the window 62, which in turn increases the interface minority carrier recombination and reduces the open circuit voltage ($V_{oc}$) of the sub-cell.

Because the resulting open circuit voltage ($V_{oc}$) of the illustrated solar cell can be higher than the open circuit voltage of a similar solar cell that does not include the undoped (or unintentionally doped) barrier layer 64, a higher operating voltage, as well as higher power, can be obtained. That, in turn, can increase the efficiency of the solar cell. Therefore, the addition of the undoped, or unintentionally doped, barrier layer 64 can facilitate fabrication of an efficient solar cell 20 having a multi-junction solar cell structure 22.

Figure 4:
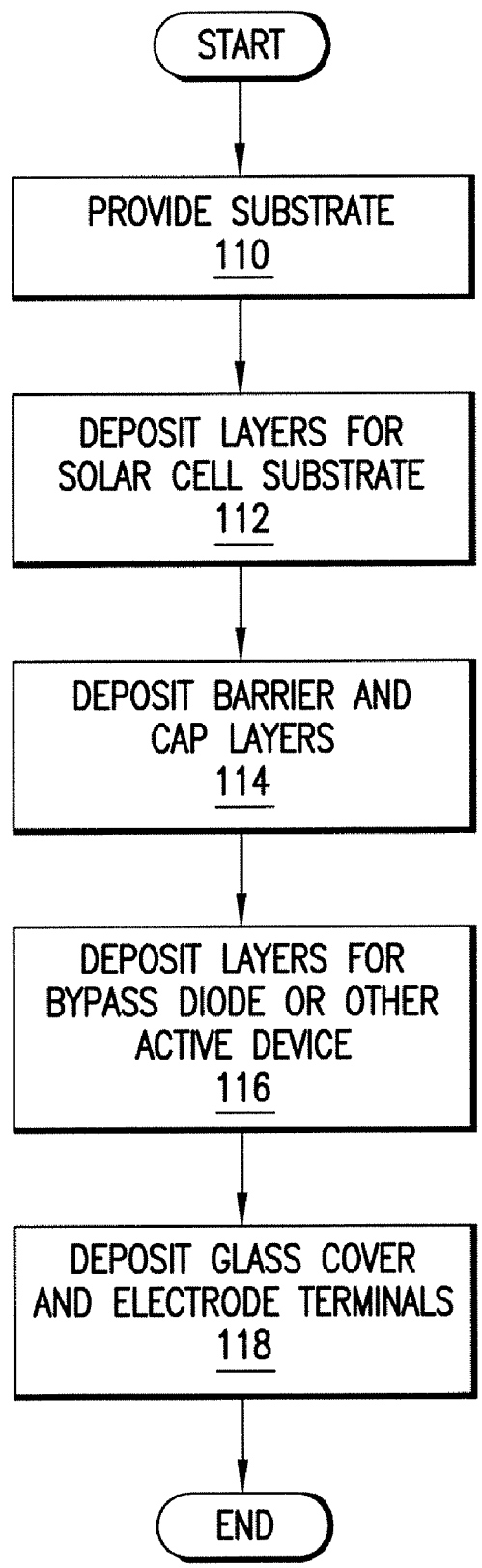
FIG. 4 is a flow chart of an example of a method according to the invention.

FIG. 4 is a flow chart illustrating a method of manufacturing a multi-junction solar cell structure with a bypass diode in accordance with an embodiment of the present invention. At block 110, the process includes providing a germanium substrate. The germanium substrate can be provided with a contact layer. Once the substrate is provided, the process moves to block 112.

At block 112, the process includes depositing a sequence of layers for a solar cell structure. In some embodiments, the solar cell is a triple-junction solar cell, which includes bottom, middle, and top sub-cells. The homo-junction sub-cells can be replaced with hetero-junction sub-cells. After the solar cell sub-cell layers are formed, the process proceeds to block 114.

At block 114, the process includes depositing a barrier layer and cap layer. First, a barrier layer is deposited over the window of the top sub-cell. Then, a doped cap layer is deposited on the barrier layer, so that the highly-doped cap layer is spatially separated from the window of the top sub-cell. As explained above, the barrier layer is either undoped or has a silicon density that is significantly lower than the silicon density of the cap layer. Preferably, the barrier layer 64 is undoped, or only unintentionally doped. Once the barrier and cap layers are deposited, the process proceeds to block 116.

At block 116, the process includes depositing a bypass diode or other active device over the cap layer. In one embodiment, after a stop etch layer is deposited on the cap layer, an n-type $In_{0.015}GaAs$ layer is deposited over the stop etch layer. Next, an i-type $In_{0.015}GaAs$ layer is deposited over the n-type layer, and a p-type $In_{0.015}GaAs$ layer is deposited over the i-type layer. In one embodiment, the concentration of n dopant in the n-type $In_{0.015}GaAs$ layer is between $10^{17}$ to $10^{18}$ $cm^{-3}$. Like the n-type layer, the concentration of p-type dopant in the p-type $In_{0.015}GaAs$ layer is between $10^{17}$ to $10^{18}$ $cm^{-3}$. In contrast, the concentration of dopant for the i-type $In_{0.015}GaAs$ layer is less than $10^{16}$ $cm^{-3}$ in the particular implementation.

Other fabrication steps subsequently may be performed. For example, as indicated by block 118, a glass cover and electrode terminals can be deposited to complete formation of the solar cell.

Other implementations are within the scope of the claims.

What is claimed is:

1. A solar cell comprising:
    a semiconductor substrate;
    a sequence of semiconductor layers disposed over the substrate to form a plurality of subcell structures including a top subcell structure and a bottom subcell structure, wherein the top subcell structure includes a back surface field layer, a base layer directly over the back surface field layer, an emitter layer directly over the base layer, and a semiconductor window layer directly over the emitter layer;
    a semiconductor barrier layer over the window layer of the top subcell structure, wherein the semiconductor barrier layer does not constitute a base or emitter of any subcell structure; and
    a semiconductor silicon-containing cap layer over the barrier layer, wherein the semiconductor barrier layer either includes no silicon or has a silicon concentration that is at least 50% lower than the silicon concentration of the cap layer.

2. The solar cell of claim 1 wherein the concentration of silicon in the barrier layer is at least two orders of magnitude less than the silicon concentration of the cap layer.

3. The solar cell of claim 1 wherein the barrier layer is thicker than the cap layer.

4. The solar cell of claim 3 wherein the barrier layer is at least several times thicker than the cap layer.

5. The solar cell of claim 1 wherein each of the barrier layer and the cap layer comprises a III-V semiconductor compound.

6. The solar cell of claim 5 wherein the window layer comprises a III-V semiconductor compound containing aluminum.

7. The solar cell of claim 1 wherein the window layer comprises a III-V semiconductor compound containing aluminum, each of the barrier layer and cap layer comprises a III-V semiconductor compound, and the barrier layer has a silicon concentration that is at least two orders of magnitude less than the silicon concentration of the cap layer.

8. The solar cell of claim 7 wherein the sequence of semiconductor layers comprises a multi-junction solar cell structure having a plurality of sub-cells stacked one above the other, wherein the window layer is near the top of the stack of sub-cells.

9. The solar cell of claim 7 wherein the concentration of silicon in the cap layer is in a range of about $1\times10^{18}$ $cm^{-3}$ to about $1\times10^{19}$ $cm^{-3}$.

10. The solar cell of claim 7 wherein the concentration of silicon in the cap layer is in a range of about $5\times10^{18}$ $cm^{-3}$ to about $6\times10^{18}$ $cm^{-3}$.

11. The solar cell of claim 7 wherein the barrier and cap layers comprise InGaAs.

12. A method of fabricating a solar cell comprising:
    depositing a sequence of semiconductor layers to form a solar cell structure over a semiconductor substrate, wherein the sequence of semiconductor layers includes a base layer, an emitter layer directly over the base layer, and a window layer directly over the emitter layer;
    depositing a semiconductor barrier layer directly over the window layer; and
    depositing a semiconductor silicon-containing cap layer directly over the barrier layer, wherein the barrier layer either includes no silicon or has a silicon concentration that is at least 50% lower than the silicon concentration of the cap layer.

13. The method of claim 12 wherein the barrier layer has a silicon concentration that is at least two orders of magnitude less than the silicon concentration of the cap layer.

14. The method of claim 12 including depositing the cap layer to have a thickness less than the barrier layer.

15. The method of claim 14 including depositing the cap layer to have a thickness at least several times less than the barrier layer.

16. The method of claim 12 wherein each of the barrier and cap layers comprises a III-V semiconductor compound.

17. The method of claim 16 wherein the window comprises a III-V semiconductor compound containing aluminum.

18. The method of claim 12 wherein the window comprises a III-V semiconductor compound containing aluminum, each of the barrier and cap layers comprises a III-V semiconductor compound, and the barrier layer has a silicon concentration that is at least two orders of magnitude less than the silicon concentration of the cap layer.

19. The method of claim 18 wherein including depositing the sequence of semiconductor layers to form a multi junction solar cell structure having a plurality of sub-cells stacked one above the other, wherein the window is near the top of the stack of sub-cells.

20. The method of claim 18 wherein the concentration of silicon in the cap layer is in a range of about $1\times10^{18}$ cm$^{-3}$ to about $1\times10^{19}$ cm$^{-3}$.

21. The method of claim 18 wherein the concentration of silicon in the cap layer is in a range of about $5\times10^{18}$ cm$^{-3}$ to about $6\times10^{18}$ cm$^{-3}$.

22. The method of claim 18 wherein the barrier and cap layers comprise InGaAs.

23. The method of claim 12 including depositing layers for an integral active device over at least a portion of the cap layer.

24. The method of claim 12 including depositing layers for an integral bypass diode over at least a portion of the cap layer.

25. The method of claim 24 including depositing an etch-stop layer over the cap layer before depositing the layers for the integral bypass diode.

26. The method of claim 25 wherein the etch stop layer comprises AlGaAs.

27. A solar cell comprising:
a semiconductor substrate;
a sequence of semiconductor layers disposed over the substrate, wherein the sequence of semiconductor layers includes a top subcell structure and a bottom subcell structure, and wherein the top subcell structure-includes a base layer, an emitter layer directly over the base layer, and a window layer directly over the emitter layer; and
a semiconductor silicon-containing cap layer over the window layer of the top subcell structure, wherein the cap layer is spatially separated from the window layer of the top subcell structure by a semiconductor barrier layer to prevent diffusion of silicon from the cap layer into the window layer.

28. A method of fabricating a solar cell comprising:
depositing a sequence of semiconductor layers including a top subcell structure and a bottom subcell structure to form a solar cell structure over a semiconductor substrate, wherein the top subcell structure includes a base layer, an emitter layer directly over the base layer, and a window layer directly over the emitter layer;
depositing a semiconductor barrier layer directly over the window layer; and
depositing a semiconductor silicon-containing cap layer over the barrier layer, wherein the barrier layer prevents diffusion of silicon from the cap layer into the window layer of the top subcell structure.

29. The method of claim 28, wherein the semiconductor barrier layer is an undoped or unintentionally doped layer that does not constitute a base or emitter layer of any subcell structure.

30. The solar cell of claim 27, wherein the semiconductor barrier layer is an undoped or unintentionally doped layer that does not constitute a base or emitter layer of any subcell structure.

* * * * *

UNITED STATES PATENT AND TRADEMARK OFFICE
CERTIFICATE OF CORRECTION

PATENT NO. : 7,842,881 B2
APPLICATION NO. : 11/550881
DATED : November 30, 2010
INVENTOR(S) : Arthur Cornfeld et al.

It is certified that error appears in the above-identified patent and that said Letters Patent is hereby corrected as shown below:

Title page, top, change "Comfeld et al." to --Cornfeld et al.--; under Inventors (INID code (75)) change "Arthur Comfeld" to --Arthur Cornfeld-- and "Mark N. Stan" to --Mark A. Stan--.

Column 1, line 48, delete "have".

Column 2, line 28, delete "a"; line 60, delete second instance of "and the".

Column 3, line 40, change "phosphide" to --phosphide$_2$--.

Column 4, line 28, insert --germanium-- before "Ge".

Column 8, line 8, change "structure-includes" to --structure includes--.

Signed and Sealed this
First Day of February, 2011

David J. Kappos
*Director of the United States Patent and Trademark Office*

UNITED STATES PATENT AND TRADEMARK OFFICE
CERTIFICATE OF CORRECTION

PATENT NO. : 7,842,881 B2  
APPLICATION NO. : 11/550881  
DATED : November 30, 2010  
INVENTOR(S) : Cornfeld et al.

Page 1 of 1

It is certified that error appears in the above-identified patent and that said Letters Patent is hereby corrected as shown below:

Title page, top, change "Comfeld et al." to --Cornfeld et al.--; under Inventors (item (75)) change "Arthur Comfeld" to --Arthur Cornfeld-- and "Mark N. Stan" to --Mark A. Stan--.

In the Specification

Column 1, beginning at line 7, delete:

"The U.S. Government has a paid-up license in the invention and the right in limited circumstances to require the patent owner to license others on reasonable terms as provided for by the terms of AFRL Agreement FA9453-04-2-0041 awarded by the Air Force Research Laboratory."

And replace with:

--This invention was made with Government support under contract FA9453-04-2-0041 awarded by the United States Air Force. The Government has certain rights in the invention.--.

Column 1, line 48, delete "have".

Column 2, line 28, delete "a"; line 60, delete second instance of "and the".

Column 3, line 40, change "phosphide" to --phosphide$_2$--.

Column 4, line 28, insert --germanium-- before "Ge".

Column 8, line 8, change "structure-includes" to --structure includes--.

Signed and Sealed this  
Fifth Day of April, 2016

Michelle K. Lee  
*Director of the United States Patent and Trademark Office*